United States Patent [19]

Van Den Enden et al.

[11] Patent Number: 5,768,293
[45] Date of Patent: Jun. 16, 1998

[54] DIGITAL TRANSMISSION AND RECORDING SYSTEM WITH SIMPLE ERROR CORRECTION

[75] Inventors: Gijsbert J. Van Den Enden; Kornelis A. Schouhamer-Immink, both of Eindhoven, Netherlands

[73] Assignee: U.S. Philips Corporation, New York, N.Y.

[21] Appl. No.: 534,915

[22] Filed: Sep. 28, 1995

[30] Foreign Application Priority Data

Oct. 31, 1994 [EP] European Pat. Off. ............. 94203160

[51] Int. Cl.$^6$ .................................................. H03M 13/00
[52] U.S. Cl. ......................... 371/37.1; 375/316; 375/340; 375/341
[58] Field of Search ...................... 371/37.1, 37.2, 371/37.5, 37.7, 38.1, 43; 375/229, 260–268, 340, 341, 346–350; 370/479

[56] References Cited

U.S. PATENT DOCUMENTS

| | | | |
|---|---|---|---|
| 4,573,034 | 2/1986 | Immink | 341/95 |
| 5,278,846 | 1/1994 | Okayama et al. | 371/37.1 |
| 5,332,822 | 7/1994 | Kaewell, Jr. | 375/340 |
| 5,463,654 | 10/1995 | Bergmans | 375/341 |
| 5,530,725 | 6/1996 | Koch | 375/347 |
| 5,537,444 | 7/1996 | Nill et al. | 375/341 |

FOREIGN PATENT DOCUMENTS

0606724A1  7/1994  European Pat. Off. ....... H03M 13/00

*Primary Examiner*—Reba I. Elmore
*Assistant Examiner*—Emmanuel L. Moise
*Attorney, Agent, or Firm*—Michael E. Belk

[57] ABSTRACT

To obtain a detector which has considerably less complexity than a Viterbi detector without a loss of performance, there is proposed to use a code that makes it possible to distinguish types of transmission errors. As a result of this distinction of types of detection errors, there may be established what symbols can be erroneous. The minimum reliability symbol of these symbols is corrected.

10 Claims, 4 Drawing Sheets

DIGITAL TRANSMISSION AND RECORDING SYSTEM WITH SIMPLE ERROR CORRECTION

FIELD OF THE INVENTION

The invention relates to a digital transmission system comprising a transmitter which includes an encoder for converting source symbols into channel symbols, which transmitter is arranged for transmitting channel symbols to a receiver via a transmission medium and which receiver comprises a detector for deriving detected symbols from a signal received from the transmission medium.

BACKGROUND OF THE INVENTION

The invention likewise relates to a receiver for such a transmission system, a recording system and a transmission or recording method.

A transmission system as defined in the opening paragraph is known from U.S. Pat. No. 4,573,034.

Such transmission systems may be used, for example, for transmitting digital symbols through the public telephone network, for transmitting multiplex signals between telephone exchanges or for transmitting digital signals in mobile telephony systems. Said recording systems may be used for recording and reproducing digital symbols with the aid of magnetic tape or magnetic discs such as hard discs and floppy discs. Such recording systems may also be used for optical or optomagnetic discs.

For transmitting source symbols by the transmitter channel or via a recording medium respectively, these symbols are often converted into coded symbols. A possible object of coding is obtaining a coded symbol which has a frequency spectrum that meets specific requirements. One of these requirements is, for example, the lack of a DC-component, because a number of frequently used transmitting channels or recording media respectively, are incapable of transmitting a DC-component or reproducing same. Another reason for the use of coding is obtaining the possibility of correcting transmission errors. These transmission errors may be caused by thermal noise and other disturbing signals.

In the known transmission system a detector is used which makes decisions about the symbol value symbol-by-symbol. In this manner a sub-optimum detection is obtained, because the redundancy added by the coding to reduce the symbol error rate is not utilized.

SUMMARY OF THE INVENTION

It is an object of the invention to provide a transmission and recording system respectively, in which the redundancy present arising from coding is utilized for obtaining a reduced symbol error rate.

For this purpose, the invention is characterized in that the detector likewise comprises means for determining a reliability level of the detected symbols, in that the receiver comprises an error detector for establishing the occurrence of a type of detection error from at least two possible types of detection errors and establishing the erroneous symbol based upon the occurring type of detection error and the reliability level of symbols already detected previously, and in that the receiver comprises adapting means for adapting the symbol value of the erroneous symbol.

Two types of detection errors may occur in binary channel symbols. A first type of detection error is found if a transmitted symbol having the symbol value "0" is erroneously detected as a symbol having the symbol value "1". A second type of detection error is found if a transmitted symbol having the symbol value "1" is erroneously detected as a symbol having the symbol value "0". If a first type of detection error has been detected, the maximum probability error symbol is the symbol having the symbol value "1" that has the lowest reliability level. If a second type of detection error has been detected, the maximum probability error symbol is the symbol having the symbol value "0" that has the lowest reliability level. That particular symbol may then be simply inverted for correction. It is imaginable that especially with multivalued symbols the number of types of detection errors may exceed two.

It is noted that for a large number of codes the use of a Viterbi detector is also possible to obtain a reduced symbol error rate. Simulations have shown that the use of the invention leads to a similar transmission error rate to the rate found when a Viterbi detector is used. A Viterbi detector, however, has considerably larger complexity than the receiver of the transmission system according to the invention.

An embodiment of the invention is characterized in that the detector is likewise arranged for updating a minimum reliability symbol with the corresponding reliability level for each of the possible types of detection errors.

By updating the minimum reliability symbol for each type of detection error, the symbol to be corrected is immediately available when that particular type of detection error occurs, which favourably affects the speed of the correction and thus the maximum permissible processing rate.

A further embodiment of the invention is characterized in that the detector is arranged for replacing the minimum reliability symbol for each of the types of detection errors by a more recent symbol if a correction possibility for symbols older than the more recent symbol is lacking.

If there is no longer a correction possibility for older symbols, which correction leads to a valid codeword, it is unlikely for one of these older symbols to be erroneous. In that case preference is given to substituting a more recent (more reliable) symbol for the minimum reliability symbol.

To correct more than one error, for example, three minimum reliability symbols may be updated, while always the symbol having the least reliability of the three is updated when an error is detected.

BRIEF DESCRIPTION OF THE DRAWINGS

The invention will now be further explained with reference to the drawing Figures, in which.

DETAILED DESCRIPTION OF THE DRAWINGS

Figure 1:
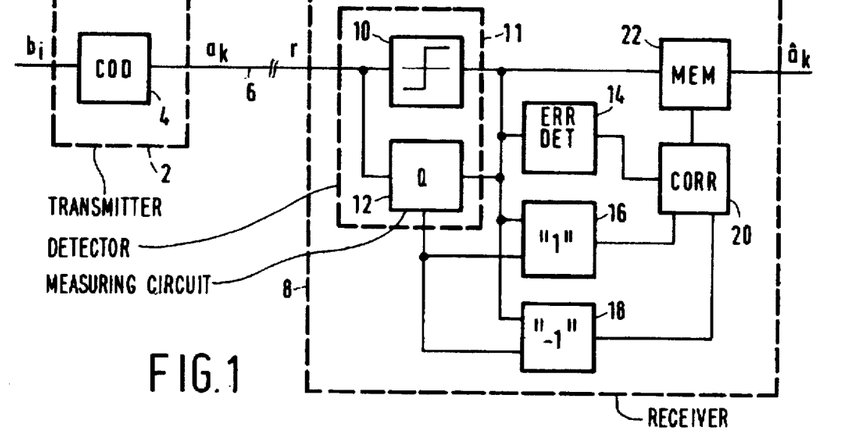
FIG. 1 shows a transmission system according to the invention.

In the transmission system shown in FIG. 1 the transmit symbols $b_i$ are applied to an input of a transmitter 2. The input of the transmitter 2 is connected to an input of an encoder 4. The output of the encoder 4 is coupled to the output of the transmitter 2. The output of the transmitter 2 is coupled to an input of a receiver 8 by the channel 6.

The input signal r of the receiver 8 is applied to an input of a detector 11. Inside the detector that particular input signal is applied to an input of a decision circuit 10 and to an input of measuring means 12 for determining the reliability level of the detected symbols. An output of the decision circuit 10 is connected to an input of the measuring circuit 12, a memory 22, memory elements 16 and 18 and an input of an error detector 14. An output of the measuring circuit 12 is connected to an input of the memory circuits 16 and 18.

An output of each of the memory circuits 16 and 18 is connected to a corresponding input of a correction means 20. So is connected an output of the error detector 14 to an input of the correction means 20. An output of the correction means 20 is connected to an input of the memory 22. An output of the memory 22 forms the output of the receiver 8.

The transmit symbols $b_i$ are converted by the encoder 4 into coded symbols $a_k$. This coding is obtained by utilizing a block code, a code resulting in a so-termed partial response signal, or a convolution code.

The transmitted symbols $a_k$ result in a signal r on the input of the receiver 8. This signal r includes disturbance signals such as noise or crosstalk in addition to the signal representing the symbols $a_k$.

The decision circuit 10 makes (provisional) decisions about the value of the symbol $a_k$ and feeds these decisions to the memory 22. The measuring circuit 12 determines from the signal r and the dedicated output symbol of the decision circuit 10 the reliability level of that particular symbol. The reliability level may, for example, be equal to the difference of the expected value of the signal r in the absence of disturbance signals and the current value of that signal r. The larger the difference is, all the larger the disturbance signal is and all the smaller the reliability of that particular symbol is.

The minimum reliability symbol belonging to a first type of detection error together with the appropriate position is stored in the memory circuit 16 and the minimum reliability symbol belonging to a second type of detection error is stored in memory circuit 18. A first type of detection error may, for example, be found if a symbol value +1 is detected, whereas a symbol value −1 has been transmitted. The second type of detection error is then found if a symbol value −1 is detected, whereas a symbol value +1 has been transmitted. In the memory circuit 16 the position of the minimum reliability symbol +1 is stored, whereas in memory circuit 18 the minimum reliability symbol −1 is stored.

The error detector 11 detects the occurrence of transmission errors and additionally indicates what type of detection error has occurred. For this purpose, the detector utilizes certain properties of the code used, as will be explained hereafter. If the error detector detects a first type of detection error, it is obvious that only a detected symbol value that may give rise to that particular type of detection error is eligible for correction. The correction circuit 20 takes the position of the minimum reliability symbol from the memory circuit that accommodates that particular type of detection error, and the symbol at that position is corrected. This is effected by selecting that particular symbol in memory 22 on the basis of the position found and, subsequently, changing its symbol value. The larger the number of types of detection errors is, the more the probability increases that really the erroneously transmitted symbol is corrected. Simulations for an 8–10 block code have shown that the performance of a detector according to the invention utilizing only two types of detection errors measures up to the performance of a (much more complex) Viterbi detector.

Figure 2:
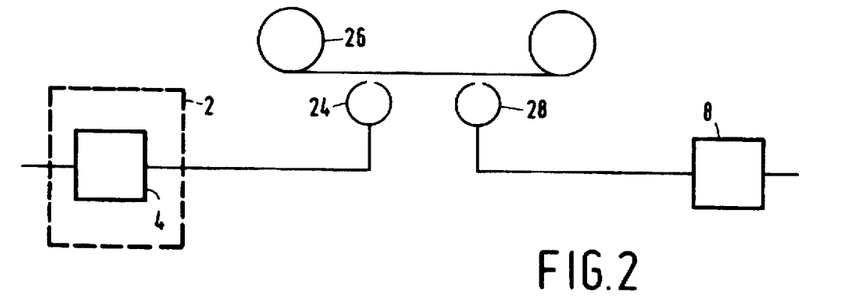
FIG. 2 shows a recording system according to the invention.

In the magnetic recording system shown in FIG. 2 the symbols to be recorded are coded by an encoder 4 in the write means 2. The output signal of the write means 4 is applied to a write head 24. This write head 24 writes the recording symbols on the recording medium which in this case is formed by a magnetic tape 26. When the recorded symbols are reconstituted, a read signal is obtained by means of a read head 28. This read signal is converted into reconstituted symbols by the reading means 8 which may have a similar structure to the receiver 8 shown in FIG. 1.

Figure 3:
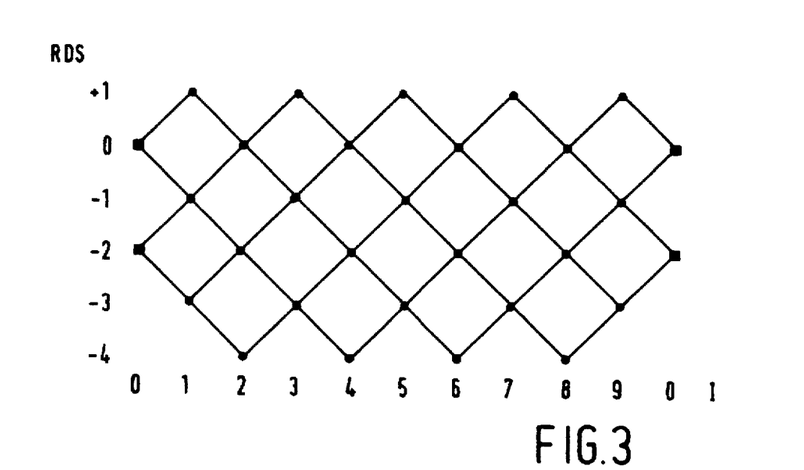
FIG. 3 shows the trellis of an 8–10 block code.

In FIG. 3 a so-termed trellis of an 8–10 block code is shown. Such a block code is known from U.S. Pat. No. 4,573,034. The trellis presents the possible values of the so-called running digital sum as a function of the position of a symbol in a word. The running digital sum is defined as $$RDS = \sum_{i=-\infty}^{i=k} a_i$$

In the code whose trellis is shown in FIG. 3, the running digital sum is bounded by −4 and +1. A code whose running digital sum is bounded is DC-free. At the word-boundaries of the code shown in FIG. 3 the running digital sum can assume only either digital value 0 or −2. If the running digital sum at a word-boundary exceeds 0, or if the running digital sum within a word exceeds +1, a transmission error has certainly occurred. In addition, it is known then that a symbol transmitted as −1 has been received as +1. Such a transmission error may be considered a first type of detection error. The maximum probability error symbol is then the minimum reliability symbol having the symbol value +1. If the running digital sum at a word-boundary is smaller than −2, or if the running digital sum within a word is smaller than −4, it is also certain that a transmission error has occurred. Additionally, it is known then that a symbol transmitted as +1 has been received as −1. Such a transmission error may be considered a second type of detection error. The maximum probability error symbol is then the minimum reliability symbol having the symbol value −1.

If the running digital sum at a word-boundary is equal to 0 or within a word is equal to +1, it is no longer possible to change a previously received symbol having the value −1 into a symbol having the value +1,because the instruction relating to the running digital sum would then be violated. In a suchlike situation it is no longer use retaining an older unreliable symbol having the value −1. In a suchlike situation the minimum reliability symbol having value −1 becomes the next symbol having that value.

If the running digital sum at a word-boundary is equal to −2 or within a word is equal to −2, it is no longer possible to change a previously received symbol having the value +1 into a symbol having a value −1, because in that case the instruction relating to the running digital value would be violated. In a suchlike situation it is no longer use retaining an older unreliable symbol having the value +1. In a suchlike situation the minimum reliability symbol having the value +1 becomes the next symbol having that value.

In the flow chart shown in FIG. 4 the instructions have the connotations according to the Table below:

| Nr. | Inscription | Connotation |
| --- | --- | --- |
| 30 | Start | Start of the program and initialization of variables. |
| 32 | I: = 0 | The variable I is made equal to 0. |
| 34 | NEXT r,N | The next sample r of the input signal is determined and the running index N is increased. |
| 36 | $â_N$: = SGN(r) | The next value of â is determined from the sample r. |
| 38 | RDS: = RDS + $â_N$ | The new value of the running digital sum is determined. |
| 40 | $â_N$ = +1? | A check is made whether $â_N$ is equal to +1. |
| 42 | UPDATE MN,MNI | The minimum reliability symbol +1 and the corresponding position are updated, as required. |
| 44 | UPDATE MX,MXI | The minimum reliability symbol −1 and the corresponding position are updated, as required. |
| 46 | (RDS > 1) OR (I = 0 and RDS > 0)? | A check is made whether the running digital sum is not too large. |
| 48 | INVERT $â_{MNI}$ | The minimum reliability symbol +1 is inverted. |
| 50 | ADAPT MN,MNI | The reliability level and the position of the minimum reliability symbol +1 are adapted. |
| 52 | (RDS < −4) OR (I = 0 AND RDS < −2)? | A check is made whether the running digital sum is not too small. |
| 54 | INVERT $â_{MXI}$ | The minimum reliability symbol −1 is inverted. |
| 56 | ADAPT MX,MXI | The reliability level and the position of the minimum reliability symbol +1 are adapted. |
| 58 | (RDS = +1) OR (I = 0 AND RDS = 0)? | A check is made whether a correction possibility of older symbols having the value −1 is still possible. |
| 60 | RESET MX,MXI | The next +1 is considered the minimum reliability symbol +1. |
| 62 | (RDS = −4) OR (I = 0 AND RDS = −2)? | A check is made whether a correction possibility of older symbols having the value +1 is still possible. |
| 64 | RESET MN,MNI | The next −1 is considered the minimum reliability symbol −1. |
| 66 | I = 9? | A check is made whether the word-boundary has been reached. |
| 68 | I: = I + 1 | The value of I is increased. |

Figure 4:
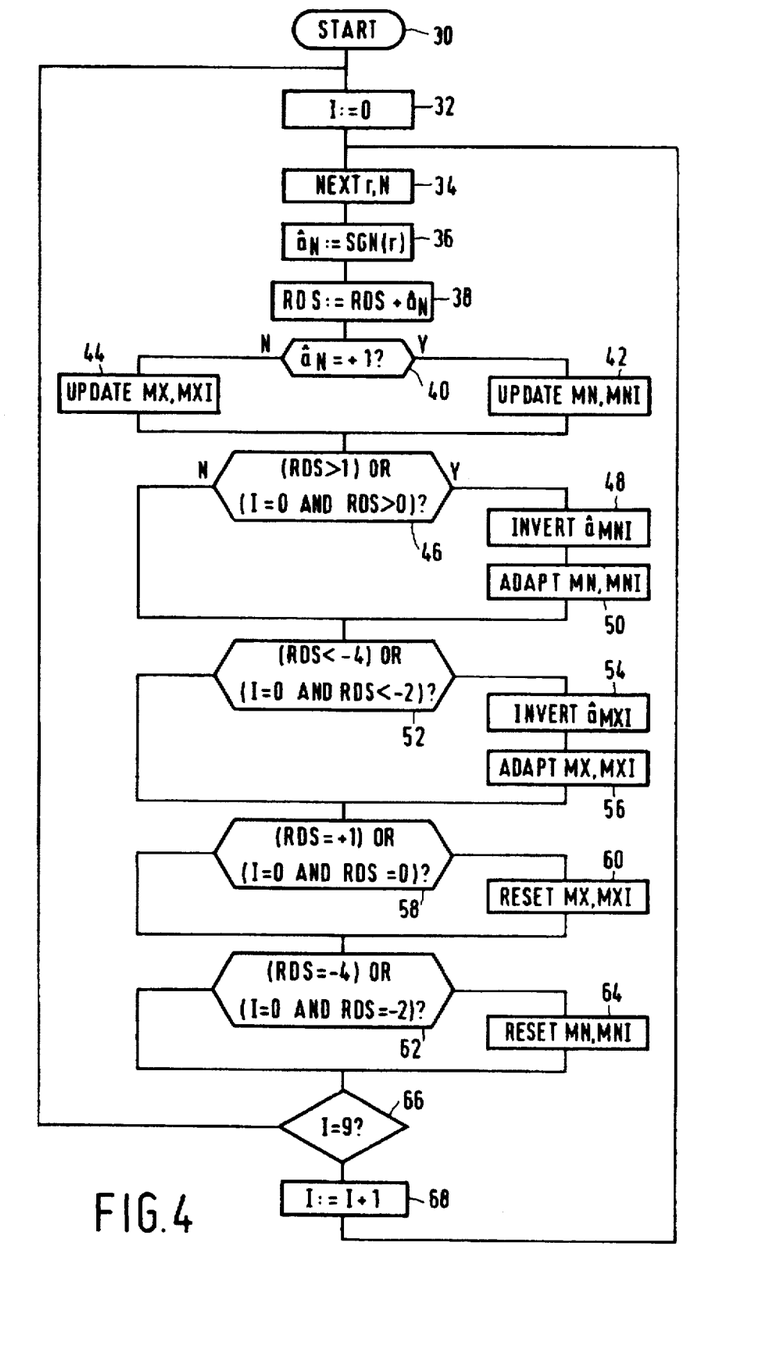
FIG. 4 shows a flow chart of a program for a programmable processor for implementation of the invention for the 8–10 block code.

The invention may also be implemented by a programmable processor executing the program as shown in the flow chart of FIG. 4. There is assumed that the transmitted symbols can assume only the value +1 or −1. Furthermore, there is assumed that the symbols are coded with an 8–10 block code whose trellis is shown in FIG. 3.

In instruction 30 the variables needed are initialized and word synchronization is waited for. After the last sample of the received signal belonging to a certain word has been received, instruction 32 is proceeded to for which the counter I is set to zero. In instruction 34 the next sample is taken from the received signal and the running index N is increased by 1. In instruction 36 the value of the symbol $â_N$ is determined from the sign of the sample r. If the sign of the sample r is positive, the value of the symbol $â_N$ is equal to +1. If the sign of the sample r is negative, the value of the symbol $â_N$ is equal to −1. In instruction 38 the new value of the running digital sum is computed by adding the value of the symbol $â_N$ to the old value of the running digital sum.

In instruction 40 there is checked whether $â_N$ is equal to +1. If it is, the minimum reliability symbol +1 is determined in instruction 42. This is effected by comparing the value r with the smallest value of r found during a certain time interval in the past. The smaller the value of r is, the less reliable becomes the decision leading to a value of $â_N$ which is equal to +1. The minimum value of r is retained in the variable MN, while the value of N belonging to the corresponding symbol is retained in the variable MNI. If the new value of r is smaller than MN, the new value of MN becomes equal to r and the value MNI becomes equal to the current value of N. Likewise it is imaginable to retain not only the minimum reliability symbols having the value +1, but, for example, the three minimum reliability symbols having the value +1. This may be useful, for example, when so-called burst errors occur in which a plurality of successive symbols are erroneous.

If the value of $â_N$ is equal to −1, the minimum reliability symbol −1 is determined in instruction 44. This is effected by comparing the value r with the maximum value of r found during a certain time interval in the past. The greater (less negative) the value of r is, the more unreliable the decision leading to a value of $â_N$ which is equal to −1 becomes. The maximum value of r is retained in the variable MX, while the value of N belonging to the corresponding symbol is retained in the variable MXI. If the new value of r exceeds MX, the new value of MX becomes equal to r and the value of MXI becomes equal to the current value of N.

In instruction 46 a check is made whether the running digital sum is not larger than permitted according to the code. If the running digital sum is too large, this means that a symbol having a value −1 has erroneously been detected as a symbol having the value +1. Finding too large a running digital sum is finding a first type of detection error. The maximum probability error symbol is then the previously determined minimum reliability symbol having the value +1. Therefore, in instruction 48 the symbol value of this minimum reliability symbol $â_{MNI}$ is inverted. In instruction 50 the values MN and MNI are adapted. If no more than the minimum reliability symbol having the value +1 is updated, MN may be set to a very large value. This leads to the fact that the next symbol having the value +1 then becomes the minimum reliability symbol having the value +1.

If, for example, the three minimum reliability symbols having the value +1 are updated, the value MN is replaced by the value of r belonging to the minimum reliability symbol but one, after the symbol having the least reliability of the three has been corrected. The value of MNI is then replaced by the value of N belonging to the minimum reliability symbol but one having symbol value +1.

In instruction 52 there is checked whether the running digital sum is not smaller than permitted according to the code. If the running digital sum is too small, this means that a symbol having a value +1 has erroneously been detected as a symbol having the value −1. Finding too small a running digital sum is finding a second type of detection error. The maximum probability error symbol is then the previously determined minimum reliability symbol having a value +1. Therefore, in instruction 54 the symbol value of this minimum reliability symbol $â_{MNI}$ is inverted. In instruction 56 the values MX and MXI are adapted. If no more than the minimum reliability symbol having the value −1 is updated, MX may be set to a very small value. This leads to the fact that the next symbol having the value −1 then becomes the minimum reliability symbol having the value −1.

If, for example, the three minimum reliability symbols having the value −1 are updated, the value MX is replaced by the value of r belonging to the minimum reliability symbol but one having value −1, after the symbol having the least reliability of the three has been corrected. The value of MXI is then replaced by the value of N belonging to the minimum reliability symbol but one having the value −1.

In instruction 58 there is checked whether the running digital sum assumes its maximum value. If it does, a symbol previously detected as −1 can no longer be corrected to a value +1, because otherwise the coding instruction would be violated. In that case, MX is set to a very small value in instruction 60, so that the next symbol having the value −1 becomes the minimum reliability symbol having the value −1. If the three minimum reliability symbols having the value −1 are updated, the corresponding values of r may be given three very small values.

In instruction 62 there is checked whether the running digital sum assumes its minimum value. If it does, a symbol previously detected as +1 can no longer be corrected to a value −1, because otherwise the coding instruction would again be violated. In that case MN is set to assume a very large value in instruction 64, so that the next symbol having the value +1 becomes the minimum reliability symbol having the value +1. If the three minimum reliability symbols having the value +1 are updated, the corresponding values of r may be given three very large values.

In instruction 66 there is checked whether the value of I is equal to 9. If it is, the last symbol of the word has been processed and the next sample is representative of the first symbol of a new word. In that case a jump is made straight to instruction 32. If I is unequal to 9, I is increased by 1 in instruction 68 and instruction 34 is jumped to.

Figure 5:
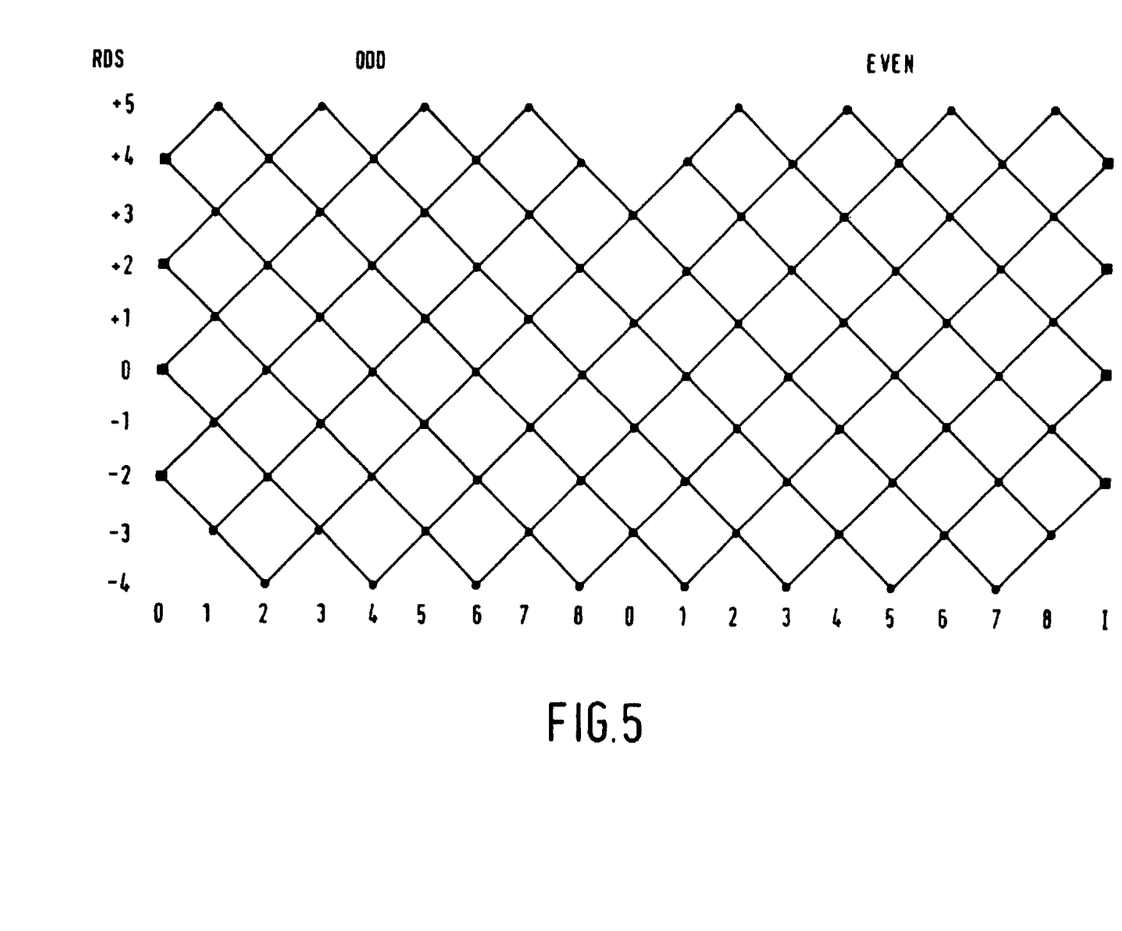
FIG. 5 shows the trellis of an 8–9 block code.

In the code whose trellis is shown in FIG. 5, the running digital sum is bounded by −4 and +5. At the word-boundaries of the code according to FIG. 5 the running digital sum at the beginning of "odd" words (ODD) can assume only of the values −2, 0, +2 or +4. If the running digital sum at the beginning of an "odd" word exceeds +4, at the beginning of an "even" (EVEN) word exceeds +3, or if the running digital sum within a word exceeds +5, a transmission error must have occurred. Furthermore, there is known then that a symbol transmitted as −1 has been received as +1. Such a transmission error may be considered to belong to a first type of detection error. The maximum probability error symbol is then the minimum reliability symbol having the symbol value +1. If the running digital sum at the beginning of an "odd" word is smaller than −2, at the beginning of an "even" word is smaller −3, or if the running digital sum within a word is smaller than −4, a transmission error must have occurred too. Furthermore, it is known then that a symbol transmitted as +1 has been received as −1. Such a transmission error may be considered to belong to a second type of detection errors. The maximum probability error symbol is then the minimum reliability symbol having symbol value −1.

If the running digital sum at the beginning of an "odd" word is equal to +4, at the beginning of an "even" word is equal to +3 or within a word is equal to +5, it is no longer possible to change a previously received symbol having the value −1 into a symbol having the value +1, because in that case the instruction relating to the running digital sum would be violated. In such a case it is no longer use retaining an older unreliable symbol having the value −1. In a situation like that the minimum reliability symbol having the value −1 becomes the next symbol having that value −1.

If the running digital sum at the beginning of an "odd" word is equal to −2, at the beginning of an "even" word is equal to −3 or within a word is equal to −4, it is no longer possible to change a previously received symbol having the value +1 into a symbol having the value −1, because in that case the instruction relating to the running digital sum would be violated. In a situation like that it is no longer use retaining an older unreliable symbol having the value +1. In a situation like that the minimum reliability symbol having the value +1 becomes the next symbol having that value +1.

The program according to the flow chart shown in FIG. 4 may easily be rendered suitable for the code whose trellis is shown in FIG. 5. For this purpose, the instructions 46, 52, 58, 62 and 66 are to be replaced by the following instructions:

| 46 | (RDS > +5) OR (ODD AND I = 0 AND RDS > +4) OR (EVEN AND I = 0 AND RDS > +3) |
|----|----|
| 52 | (RDS < −4) OR (ODD AND I = 0 AND RDS < −2) OR (EVEN AND I = 0 AND RDS < −3) |
| 58 | (RDS = +5) OR (ODD AND I = 0 AND RDS = +4) OR (EVEN AND I = 0 AND RDS = +3) |
| 62 | (RDS = −4) OR (ODD AND I = 0 AND RDS = −2) OR (EVEN AND I = 0 AND RDS = −3) |
| 66 | I = 8? |

The changes in the instructions 46, 52, 58 and 62 are necessary to adapt the running digital sum to the other possible values. The change in the instruction 66 is necessary because of the smaller word length.

In the flow chart shown in FIG. 6 the instructions have the connotations according to the Table below:

| No. | Inscription | Connotation |
|---|---|---|
| 70 | START | Start of the program and initialization of the variables. |
| 72 | NEXT r,N | The next sample of the input signal is determined and the running index N is increased. |
| 74 | r < NEG | A check is made whether r is smaller than a negative threshold NEG. |
| 76 | r > POS | A check is made whether r exceeds a positive threshold POS. |
| 78 | $a_N = -1$ | The value of the symbol $a_N$ becomes equal to −1. |
| 80,85 | UPDATE MIN1,IMIN1 | The minimum reliability symbol having the value −1 or 0 with the corresponding position is updated, as required. |
| 82 | $a_N = +1$ | The value of the symbol $a_N$ becomes equal to +1. |
| 84 | $a_N = 0$ | The value of the symbol $a_N$ becomes equal to 0. |
| 86,87 | UPDATE MIN2,IMIN2 | The minimum reliability symbol having the value 0 or +1 with corresponding position is updated, as required. |
| 90 | PREV = −1? | A check is made whether the previous symbol having the value 0 is equal to −1. |
| 92 | PREV = +1? | A check is made whether the previous symbol having the value unequal to 0 is equal to +1. |

-continued

| No. | Inscription | Connotation |
|---|---|---|
| 94 | $a_{IMIN2} := a_{IMIN2} - 1$ | The value of the symbol $a_{MIN2}$ is reduced by 1. |
| 96 | $a_{IMIN1} := a_{IMIN1} + 1$ | The value of the symbol $a_{MIN2}$ is increased by 1. |
| 98 | RESET MIN1,IMIN1 | The next symbol having the value 0 or +1 becomes the minimum reliability symbol having the value 0 or +1. |
| 100 | RESET MIN2,IMIN2 | The next symbol having the value 0 or −1 becomes the minimum reliability symbol having the value 0 or +1. |
| 102 | PREV: = +1 | The previous symbol having a non-zero value obtains the value +1. |
| 104 | PREV: = −1 | The previous symbol having a non-zero value obtains the value −1. |

Figure 6:
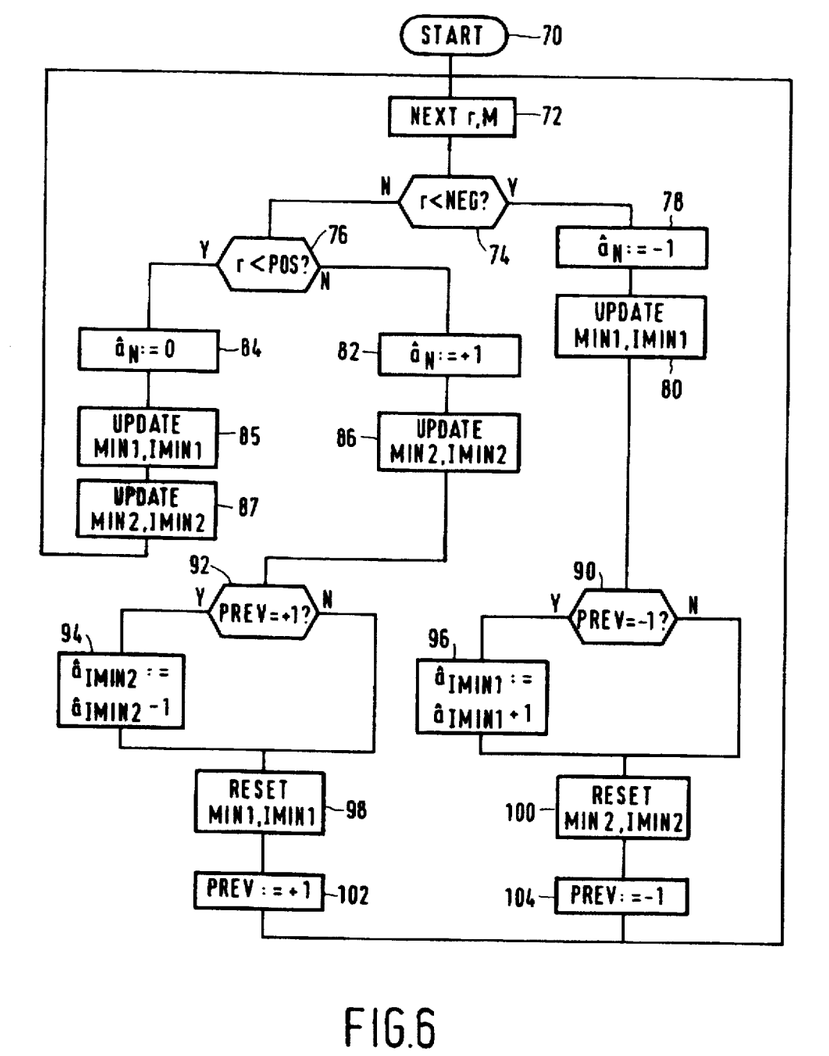
FIG. 6 shows a flow chart of a program for a programmable processor for implementation of the invention with a partial response channel that has a transfer function

In the program shown in FIG. 6 there is assumed that the received signal is a so-called partial response signal of the type 1-D. This means that the channel symbols $a_k$ are equal to $b_k-b_{k-1}$, where $b_k$ are the source symbols. The channel symbols may assume the values 31 1, 0 and +1. For such a signal it cannot happen that twice in a row the value +1 occurs, with intervening zero symbol values or not. If this occurs none the less, a transmission error must have occurred with the symbol having the value −1 received as a symbol having the value 0 or a symbol having the value 0 received as a symbol having the value +1. By way of correction, the minimum reliability symbol that may lead to that particular (first) type of detection error is reduced by 1.

With respect to the 1-D code, it cannot happen either that twice in a row the value −1 occurs either or not with intervening zero symbol values. If this occurs non the less, a transmission error has occurred for which a symbol having the value +1 has erroneously been received as a symbol having the value 0 or a symbol having the value 0 has erroneously been received as a symbol having the value −1. By way of correction, the minimum reliability symbol that may lead to that particular (second) type of detection error is increased by 1. If a symbol having the value +1 (−1) is preceded by a symbol having the value −1 (+1), with intervening zero symbol values or not, it is no longer possible to correct the symbols received in the past, because otherwise the code instruction would be violated. This means that it is no longer use remembering the corresponding minimum reliability symbols from the past. The minimum reliability symbol then becomes the most recent symbol having that particular value.

In instruction 70 the program is started and the variables obtain a suitable initial value. In instruction 72 the next sample of the received signal is determined and the running index N is increased. In instruction 74 there is checked whether the sample value r is smaller than the negative threshold NEG. If it is, the value of the symbol $a_N$ is made equal to −1. In instruction 80 the minimum reliability symbol value is adapted. This is effected by comparing the value of (NEG−r) with MIN1. If (NEG−r) is smaller than MIN1, this means that the symbol $a_N$ is the minimum reliability symbol. MIN1 is then made equal to (NEG-r) and IMIN1 is made equal to N.

In instruction 90 there is checked whether the previous non-zero symbol is equal to −1. If it is, a transmission error of the second type of detection errors has occurred and in instruction 96 the symbol value of the minimum reliability symbol $a_{IMIN1}$ is increased by 1. In instruction 100 the parameter of MIN2 is reset to a large value, and IMIN2 to N+1, so that no symbols from the past can be reduced by 1 any longer, which would otherwise lead to a violation of the coding instruction. In instruction 104 the value of PREV is set to −1, because the most recent non-zero symbol is equal to −1. Subsequently, instruction 72 is returned to.

In instruction 76 there is checked whether the sample value r is smaller than the positive threshold POS. If it is not, the value of the symbol $a_N$ is made equal to +1 in instruction 82. Otherwise the symbol $a_N$ is made equal to 0 in instruction 84. In instruction 86 the minimum reliability symbol value is updated. This is effected by comparing the value of (r−POS) with MIN1. If (r−POS) is smaller than MIN2, this means that the symbol $a_N$ is the minimum reliability symbol. MIN2 is then made equal to (r−POS) and IMIN2 is made equal to N.

In instruction 92 there is checked whether the previous non-zero symbol is equal to +b 1.If it is, a transmission error of the first type of detection errors has occurred and in instruction 94 the symbol value of the minimum reliability symbol $a_{IMIN2}$ is reduced by 1. In instruction 98 the value of MIN1 is reset to a large value, and IMIN1 to N+1, so that no symbols from the past can be increased by 1, which would otherwise lead to a violation of the coding instruction. In instruction 102 the value of PREV is set to +1, because the most recent non-zero symbol is equal to +1. Thereafter, instruction 72 is returned to.

In instruction 85 the minimum reliability symbol having the value zero or −1 is adapted. This is effected by comparing the value (r−NEG) with MIN1. If (r−NEG) is smaller than MIN1, this means that the symbol $a_N$ is the minimum reliability symbol. MIN1 is then made equal to (r−NEG), and IMIN1 is made equal to N. In instruction 87 the minimum reliability symbol having the value 0 or +1 is updated. This is effected by comparing the value (POS−r) with MIN2. If (POS−r) is smaller than MIN2, this means that the symbol $a_N$ is the minimum reliability symbol. MIN2 is then made equal to (POS−r) and IMIN2 is made equal to N. Subsequently, instruction 72 is returned to.

We claim:

1. A digital transmission system, comprising:
   transmitter which includes: an encoder with means for converting source symbols into channel symbols; and means for transmitting channel symbols to a transmission medium;

a receiver including:
   means for receiving the channel symbols from the transmission medium as a signal;
   a detector with means for deriving detected symbols from the signal and means for determining a reliability level of the detected symbols; and
   an error detector with means for establishing the occurrence of a type of detection error from at least two possible types of detection errors and establishing an erroneous symbol based upon the occurring type of detection error and the reliability level of previously detected symbols; and adapting means for adapting the symbol value of the erroneous symbol.

2. The system of claim 1, in which the detector includes means for updating a minimum reliability symbol with the corresponding reliability level for each of the possible types of detection errors.

3. The system of claim 2, in which the detector includes means for replacing the minimum reliability symbol for each of the types of detection errors, by a more recent symbol if a correction possibility for symbols older than the more recent symbol, is lacking.

4. A receiver for receiving a coded digital signal, comprising:

a detector with means for deriving detected symbols from the coded digital signal and means for determining a reliability level of the detected symbols;

an error detector with means for establishing the occurrence of a type of detection error from at least two possible types of detection errors and establishing an erroneous symbol based upon the occurring type of detection error and the reliability level of previously detected symbols; and means for adapting the symbol value of the erroneous symbol.

5. The receiver of claim 4, in which the detector includes means for updating a minimum reliability symbol with the corresponding reliability level for each of the possible types of detection errors.

6. A digital recording system, comprising:

write means including: an encoder with means for converting source symbols into recording symbols; and means for writing the recording symbols on a recording medium; and read means for reading a read signal from the recording medium and including:

a detector with means for deriving detected symbols from the read signal and means for determining a reliability level of the detected symbols;

an error detector with means for establishing the occurrence of a type of detection error from at least two possible types of detection errors and establishing an erroneous symbol based upon the occurring type of detection error and the reliability level of previously detected symbols; and adapting means for adapting the symbol value of the erroneous symbol.

7. The system of claim 6, in which the detector includes means for updating a minimum reliability symbol with the corresponding reliability level for each of the possible types of detection errors.

8. A method of transmitting digital signals, comprising:

converting source signals into channel symbols;

transmitting channel symbols by a transmitter channel;

deriving detected symbols from a signal received from the transmitter channel;

determining a reliability level of the detected symbols;

establishing the occurrence of a type of detection error based upon at least two possible types of detection errors;

establishing an erroneous symbol based upon the occurring type of detection error and the reliability level of previously detected symbols; and adapting the symbol value of the erroneous symbol.

9. A method of recording digital symbols, comprising:

converting source symbols into recording symbols;

writing the recording symbols on a recording medium;

deriving detected symbols from a signal read from the recording medium;

determining a reliability level of the detected symbols;

establishing the occurrence of a type of detection error based upon at least two possible types of detection errors;

establishing an erroneous symbol based upon the occurring type of detection error and the reliability level of previously detected symbols; and adapting the symbol value of the erroneous symbol.

10. A method of reading coded digital symbols from a recording medium, comprising:

deriving detected symbols from a signal read from the recording medium and detecting reading errors;

determining a reliability level of the detected symbols;

establishing the occurrence of a type of detection error in response to at least two possible types of detection errors;

establishing an erroneous symbol based upon the occurring type of detection error and the reliability level of previously detected symbols; and adapting the symbol value of the erroneous symbol.

* * * * *